(12) United States Patent
Yang

(10) Patent No.: US 12,519,022 B2
(45) Date of Patent: Jan. 6, 2026

(54) PACKAGING STRUCTURE AND MANUFACTURING METHOD THEREOF

(71) Applicant: JCET MANAGEMENT CO., LTD., Shanghai (CN)

(72) Inventor: Cheng Yang, Wuxi (CN)

(73) Assignee: JCET MANAGEMENT CO., LTD., Shanghai (CN)

( * ) Notice: Subject to any disclaimer, the term of this patent is extended or adjusted under 35 U.S.C. 154(b) by 477 days.

(21) Appl. No.: 18/073,108

(22) Filed: Dec. 1, 2022

(65) Prior Publication Data
US 2023/0170267 A1    Jun. 1, 2023

(30) Foreign Application Priority Data
Dec. 1, 2021   (CN) .......................... 202111450285.5

(51) Int. Cl.
*H01L 23/13* (2006.01)
*H01L 21/48* (2006.01)
(Continued)

(52) U.S. Cl.
CPC .......... *H01L 23/13* (2013.01); *H01L 21/4853* (2013.01); *H01L 21/4857* (2013.01);
(Continued)

(58) Field of Classification Search
CPC . H01L 23/13; H01L 23/3675; H01L 23/3735; H01L 23/49816; H01L 23/49822; H01L 23/49833; H01L 23/49838; H01L 25/0657; H01L 25/50; H01L 2224/16145; H01L 2224/16225; H01L 2224/32245; H01L 2224/73253; H01L 2225/06513; H01L 2225/06517; H01L 2225/06524;
(Continued)

(56) References Cited

U.S. PATENT DOCUMENTS 5,646,828 A * 7/1997 Degani ............... H01L 23/5385
257/E23.008
6,265,771 B1 * 7/2001 Ference .............. H01L 25/0657
257/676
(Continued)

FOREIGN PATENT DOCUMENTS

JP         2009231537 A    10/2009

*Primary Examiner* — Peniel M Gumedzoe
(74) *Attorney, Agent, or Firm* — MUNCY, GEISSLER, OLDS & LOWE, P.C.

(57) ABSTRACT

The present invention provides a packaging structure and a manufacturing method thereof. The packaging structure includes a first substrate, a first chip, a second chip, a first heat conductor and a second heat conductor, wherein the first substrate includes a cavity; the first chip is embedded in the cavity and includes a first connecting surface and a first heat-conducting surface that face away from each other; the second chip is disposed on a side of the first connecting surface and electrically connected to the first chip, a side of the second chip distal from the first chip includes a second heat-conducting surface on a side; and the first heat conductor is connected to the first heat-conducting surface, and the second heat conductor is connected to the second heat-conducting surface. The first substrate includes a third connecting surface that is flush with the first connecting surface.

7 Claims, 11 Drawing Sheets

(51) Int. Cl.
*H01L 23/00* (2006.01)
*H01L 23/367* (2006.01)
*H01L 23/373* (2006.01)
*H01L 23/498* (2006.01)
*H01L 25/00* (2006.01)
*H01L 25/065* (2023.01)

(52) U.S. Cl.
CPC ...... *H01L 21/4882* (2013.01); *H01L 23/3675* (2013.01); *H01L 23/3735* (2013.01); *H01L 23/49816* (2013.01); *H01L 23/49822* (2013.01); *H01L 23/49833* (2013.01); *H01L 24/16* (2013.01); *H01L 24/32* (2013.01); *H01L 24/73* (2013.01); *H01L 25/0657* (2013.01); *H01L 25/50* (2013.01); *H01L 23/49838* (2013.01); *H01L 2224/16145* (2013.01); *H01L 2224/16225* (2013.01); *H01L 2224/32245* (2013.01); *H01L 2224/73253* (2013.01); *H01L 2225/06513* (2013.01); *H01L 2225/06517* (2013.01); *H01L 2225/06524* (2013.01); *H01L 2225/06568* (2013.01); *H01L 2225/06589* (2013.01); *H01L 2924/15151* (2013.01); *H01L 2924/152* (2013.01)

(58) Field of Classification Search
CPC . H01L 2225/06568; H01L 2225/06589; H01L 2924/15151; H01L 2924/152
See application file for complete search history.

(56) References Cited

U.S. PATENT DOCUMENTS

| | | | |
|---|---|---|---|
| 8,472,190 B2* | 6/2013 | Refai-Ahmed | H05K 1/141 361/704 |
| 2004/0217485 A1* | 11/2004 | Chung | H01L 24/73 257/E23.101 |
| 2011/0183474 A1* | 7/2011 | Shigemura | H05K 3/3494 257/E21.504 |
| 2015/0255441 A1* | 9/2015 | Lamorey | H01L 25/50 438/107 |

* cited by examiner

PACKAGING STRUCTURE AND MANUFACTURING METHOD THEREOF

TECHNICAL FIELD

The present invention belongs to the field of semiconductor packaging technologies, and particularly relates to a packaging structure and a manufacturing method thereof.

BACKGROUND

The chip-on-wafer-on-substrate (CoWoS)-based 2.5D packaging technology is to package a chip onto a silicon interposer, to interconnect them using high-density wiring on the silicon interposer, and to further connect them to a package substrate. CoWoS mainly focuses on a high-performance computing (HPC) market, for example, a high-end product with a high-bandwidth memory (HBM). At present, the silicon interposer may also be replaced with an organic interposer with a redistribution layer (RDL).

In addition, the embedded multi-die interconnect bridge (EMIB)-based advanced packaging technology is similar to 2.5D packaging of a silicon interposer and provides local high-density interconnection by embedding a silicon bridge for connection with dies into the package substrate. The EMIB technology may be used for packaging between a discrete graphics card and a high-bandwidth memory chip.

When the above-mentioned advanced packaging technology is applied to packaging of an active device for a high-bandwidth memory, 1) the presence of the interposer and the silicon bridge limits the I/O speed and leads to higher power consumption; 2) a through Si vias (TSV) process in the 2.5D packaging technology results in a high cost, the RDL is limited a lot by the wiring density, and the silicon bridge process and an assembling process are complex; and 3) 3D packaging on the active device by the TSV is costly in a packaging process and may have a problem of heat dissipation.

In addition, the chip often needs to be packaged on the package substrate to achieve transmission of electrical signals, and the laminating positional relationship between the package substrate and the chip always has an adverse impact on heat dissipation of the chip. Therefore, a problem to be solved is how to improve the heat dissipation efficiency of the chip on the premise of ensuring effective connection between the package substrate and the chip.

SUMMARY

An object of the present invention is to provide a packaging structure and a manufacturing method thereof, which can improve the heat dissipation efficiency of each chip in the packaging structure and improve the reliability of electrical connection between each chip and a package substrate.

In order to solve the above problems, a packaging structure is provided according to a technical solution of the present invention. The packaging structure includes: a first substrate including a cavity; a first chip, embedded in the cavity and including a first connecting surface and a first heat-conducting surface that face away from each other; a second chip, disposed on a side of the first connecting surface and electrically connected to the first chip, a side of the second chip distal from the first chip including a second heat-conducting surface; and a first heat conductor and a second heat conductor, the first heat conductor being connected to the first heat-conducting surface, and the second heat conductor being connected to the second heat-conducting surface. The first substrate includes a third connecting surface that is flush with the first connecting surface.

As an optional technical solution, the first substrate includes a laminated plate and a metal foil laminate piled above the laminated plate, the metal foil laminate includes a prepreg and a metal foil layer disposed on a surface of a side of the prepreg, and a surface of an outer side of the metal foil layer is provided as the third connecting surface.

As an optional technical solution, the prepreg includes resin and is laminated such that the resin enters the cavity and fixes the first chip.

As an optional technical solution, a size of the second chip is larger than a size of the first chip; a side of the second chip proximal to the first chip includes a second connecting surface; a first metal bump is disposed on a part of the second connecting surface located outside the first chip; and a second metal bump is disposed on the metal foil layer. The first metal bump and the second metal bump are in electrical connection with each other.

As an optional technical solution, the cavity runs through the metal foil laminate and at least part of the laminated plate in a thickness direction of the first substrate.

The present invention further provides a manufacturing method of a packaging structure, including:
  providing a first substrate having a cavity;
  providing a first chip, and placing the first chip into the cavity;
  pre-pressing the first substrate and the first chip;
  pressing the first substrate and the first chip to fix the first chip in the cavity;
  bonding a second chip onto a first connecting surface of the first chip; and
  connecting a first heat conductor to a first heat-conducting surface of the first chip, and connecting a second heat conductor to a second heat-conducting surface of the second chip.

A third connecting surface of the first substrate is flush with the first connecting surface.

As an optional technical solution, the first substrate includes a laminated plate and a metal foil laminate piled above the laminated plate, the metal foil laminate includes a prepreg and a metal foil layer disposed on a surface of a side of the prepreg, and a surface of the metal foil layer is provided as the third connecting surface.

As an optional technical solution, providing the first substrate having the cavity further includes: providing a carrier plate; alternately manufacturing a conductive layer and an insulating layer on a surface of the carrier plate to constitute the laminated plate; forming a first opening in the laminated plate; providing the metal foil laminate having a second opening; and piling the metal foil laminate above the laminated plate to enable the first opening and the second opening to be communicated with each other. The first opening and the second opening constitute the cavity.

As an optional technical solution, providing the first substrate having the cavity further includes: providing a carrier plate; alternately manufacturing a conductive layer and an insulating layer on a surface of the carrier plate to constitute the laminated plate; providing the metal foil laminate, and piling the metal foil laminate above the laminated plate to constitute the first substrate; and forming the cavity in the first substrate.

As an optional technical solution, the manufacturing method further includes: patterning the metal foil layer to form a plurality of bonding pad structures; and manufacturing second metal bumps or solder balls on the plurality of bonding pad structures.

Compared with the prior art, the present invention provides the packaging structure and the manufacturing method thereof. The packaging structure includes the first substrate with the first chip pre-embedded therein; the first connecting surface of the first chip is flush with the third connecting surface of the first substrate to constitute a flat surface; the substantially identical bonding pad structures are manufactured on the flat surface using a patterning process; and the metal bumps or solder balls are then manufactured on the bonding pad structures. When the metal bumps or solder balls as a whole are electrically connected to other chips and packages, the stability of the electrical connection can be improved and the packaging yield can also be increased. In addition, since the first chip is embedded in the first substrate, and respective independent heat-conducting channels for heat dissipation are formed for the first chip and the second chip by using the first heat conductor and the second heat conductor corresponding to the first chip and the second chip, respectively, the overall heat dissipation efficiency of the packaging structure is relatively high and is less influenced by the package substrate.

The present invention is described in detail below with reference to the accompanying drawings and specific embodiments, but is not intended to limit the present invention.

BRIEF DESCRIPTION OF THE DRAWINGS

For clearer descriptions of the technical solutions in the embodiments of the present invention or in the prior art, the following briefly introduces the accompanying drawings required for describing the specific embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

Figure 1:
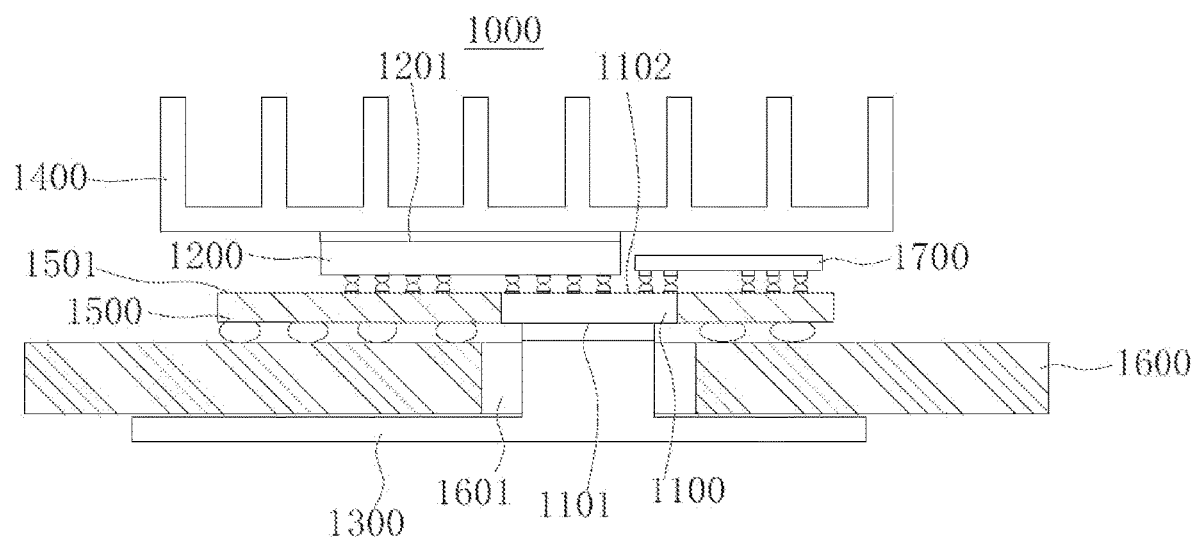
FIG. 1 is a schematic sectional diagram of a packaging structure according to a first embodiment of the present invention.

In order to make the objectives, technical solutions and advantages of the present invention clearer, the present invention will be further described in detail below with reference to the embodiments and the accompanying drawings. It should be understood that the specific embodiments described herein are only used to explain the present invention, but not to limit the present invention.

In the descriptions of the present invention, it should be understood that directional or positional relationships shown by the terms such as "center", "upper", "lower", "left", "right", "vertical", "horizontal", "inner", and "outer" are directional or positional relationships as shown in the drawings, which only intend to facilitate description of the present invention and simplify the description, but do not indicate or imply that the apparatuses or components must have specific directions, or be constructed or operated in the specific directions, and are not limitative of the present invention.

One of the objects of the present invention is to provide a packaging structure. The packaging structure includes a first chip and a second chip that are vertically connected. A first heat-conducting surface of the first chip faces away from a second heating conducting surface of the second chip. The first heat-conducting surface is provided with a first heat conductor, and the second heat-conducting surface is provided with a second heat conductor. The packaging structure further includes a first substrate having a cavity. The first chip is embedded in the first cavity and provided with a first connecting surface facing away from the first heat-conducting surface. The first connecting surface is flush with a third connecting surface of the first substrate.

Preferably, a side of the second chip facing the first chip includes a second connecting surface. A part of the second connecting surface located outside the first chip is electrically connected to the third connecting surface of the first substrate. For example, a first metal bump is disposed on a part of the second connecting surface located outside the first chip. The third connecting surface is correspondingly provided with a second metal bump. The first metal bump and the second metal bump are electrically connected by means of tin-gold bonding.

In this embodiment, the first chip is pre-embedded in the first substrate; the first connecting surface is flush with the third connecting surface to constitute a flat surface; the substantially identical bonding pad structures are manufactured on the flat surface using a patterning process; and the metal bumps or solder balls are then manufactured on the bonding pad structures. When the metal bumps or solder balls as a whole are electrically connected to other chips and packages, the stability of the electrical connection can be improved and the packaging yield can also be increased.

In addition, since the first chip is embedded in the first substrate, and respective independent heat-conducting channels for heat dissipation are formed for the first chip and the second chip by using the first heat conductor and the second heat conductor corresponding to the first chip and the second chip, respectively, the overall heat dissipation efficiency of the packaging structure is higher and is less influenced by the package substrate.

Figure 2:
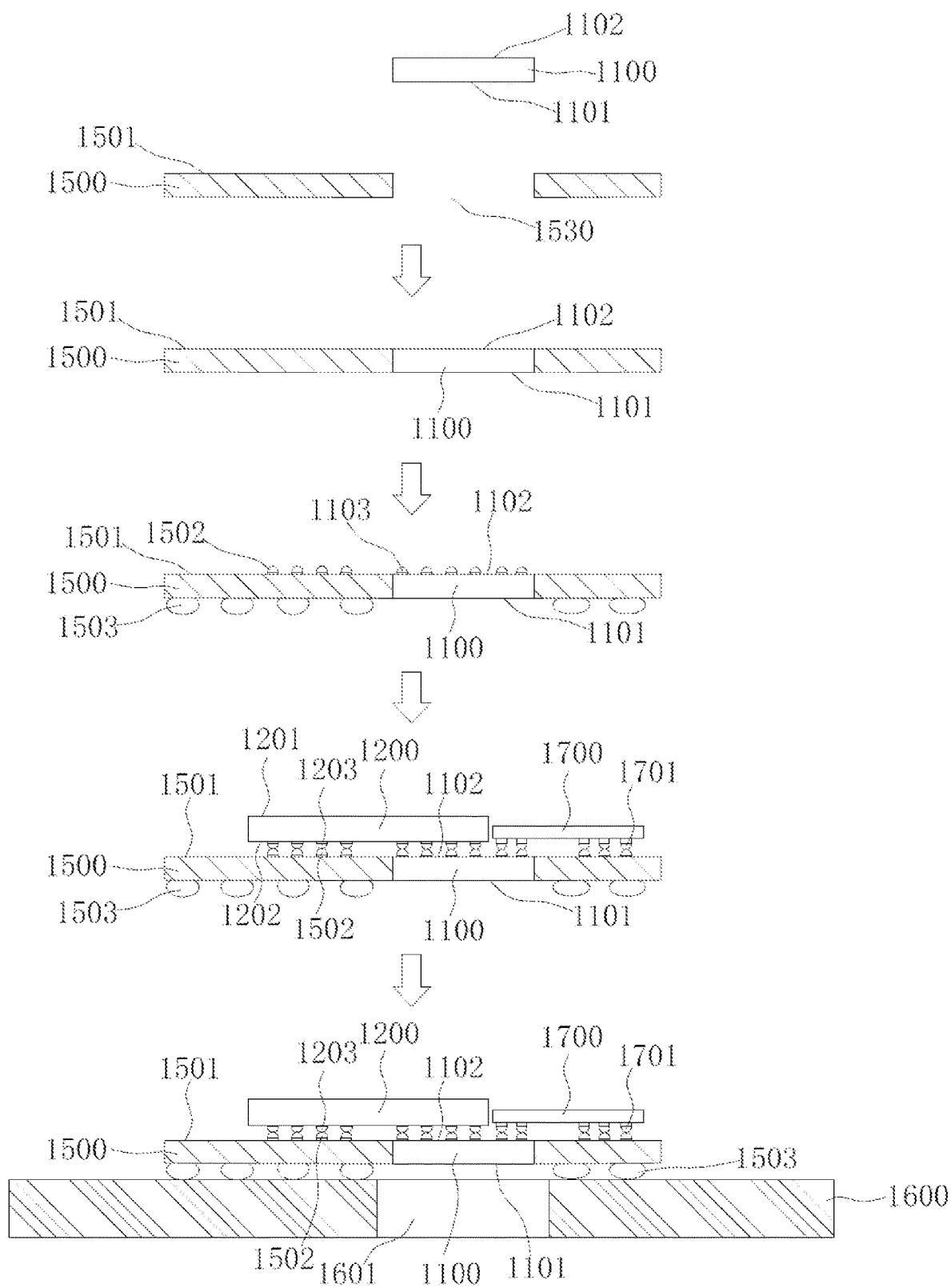
FIG. 2 is a schematic sectional diagram of a part of a manufacturing process of the packaging structure in FIG. 1.

As shown in FIGS. 1 and 2, a packaging structure 1000 is provided according to a first embodiment of the present invention, and includes: a first chip 1100, a second chip 1200, a first heat conductor 1300, a second heat conductor 1400 and a first substrate 1500. The second chip 1200 is disposed above and electrically connected to the first chip 1100. The first chip 1100 includes a first heat-conducting surface 1101 distal from the second chip 1200, and the second chip 1200 includes a second heat-conducting surface 1201 distal from the first chip 1100. The first heat conductor 1300 is connected to the first heat-conducting surface 1101, and the second heat conductor 1400 is connected to the second heat-conducting surface 1201. The first substrate 1500 includes a cavity 1530 (referring to FIG. 9). The first chip 1100 is embedded in the cavity 1530. A third connecting surface 1501 of the first substrate 1500 is flush with the first connecting surface of the first chip 1100.

In a preferred embodiment, the first heat conductor 1300 is for example a heat-conducting back plate, and the heat-conducting back plate and the first heat-conducting surface 1101 are connected by a heat-conducting glue; and the second heat conductor 1400 is for example a heat-conducting fin, and the heat-conducting fin and the second heat-conducting surface 1201 of the second chip 1200 are also connected by the heat-conducting glue. The heat-conducting back plate and the heat-conducting fin are preferably made from heat-conducting metal materials.

It can be known from FIGS. 1, 2, 7 and 9, the first substrate 1500 includes laminated plates 1510 and a metal foil laminate 1520 piled above the laminated plates 1510. The metal foil laminate 1520 includes a prepreg 1521 and a metal foil layer 1522 disposed on a surface of a side of the prepreg 1521. A surface of an outer side of the metal foil layer 1522 is provided as the third connecting surface 1501. The outer side surface of the metal foil layer 1522 refers to an exposed surface of the metal foil layer 1522.

The laminated plates 1510 refer to a multilayer structure including conductive layers 130 and insulating layers 140 that are alternately laminated. In this embodiment, the first substrate 1500 is formed by piling up multiple laminated plates 1510 and continuously piling the metal foil laminate 1520 above the uppermost-layer laminated plate 1510. In the first substrate 1500, all the conductive layers 130 of the multiple piled-up laminated plates 1510 are electrically connected through via holes 141 in the insulating layers 140.

In the metal foil laminate 1520, the metal foil layer 1522 is for example a copper foil layer. The prepreg 1521 may be covered with a copper foil layer on both sides or on one side. If the prepreg is covered with the copper foil layer on one side, the copper foil layer must be disposed on the outermost side of the prepreg 1521.

The prepreg 1521 is made from resin and a reinforcing material. The resin is, for example, one or any combination of phenolic resin, epoxy resin, melamine formaldehyde resin and polyester resin. The reinforcing material is, for example, one or any combination of glass fiber cloth, paper base and a composite material. In the packaging structure 1000 according to the present invention, in order to facilitate exudation of the resin, the prepreg 1521 is preferably but not limited to a resin coated copper (RCC) plate, and may also be a copper clad laminate (CCL).

Figure 8:
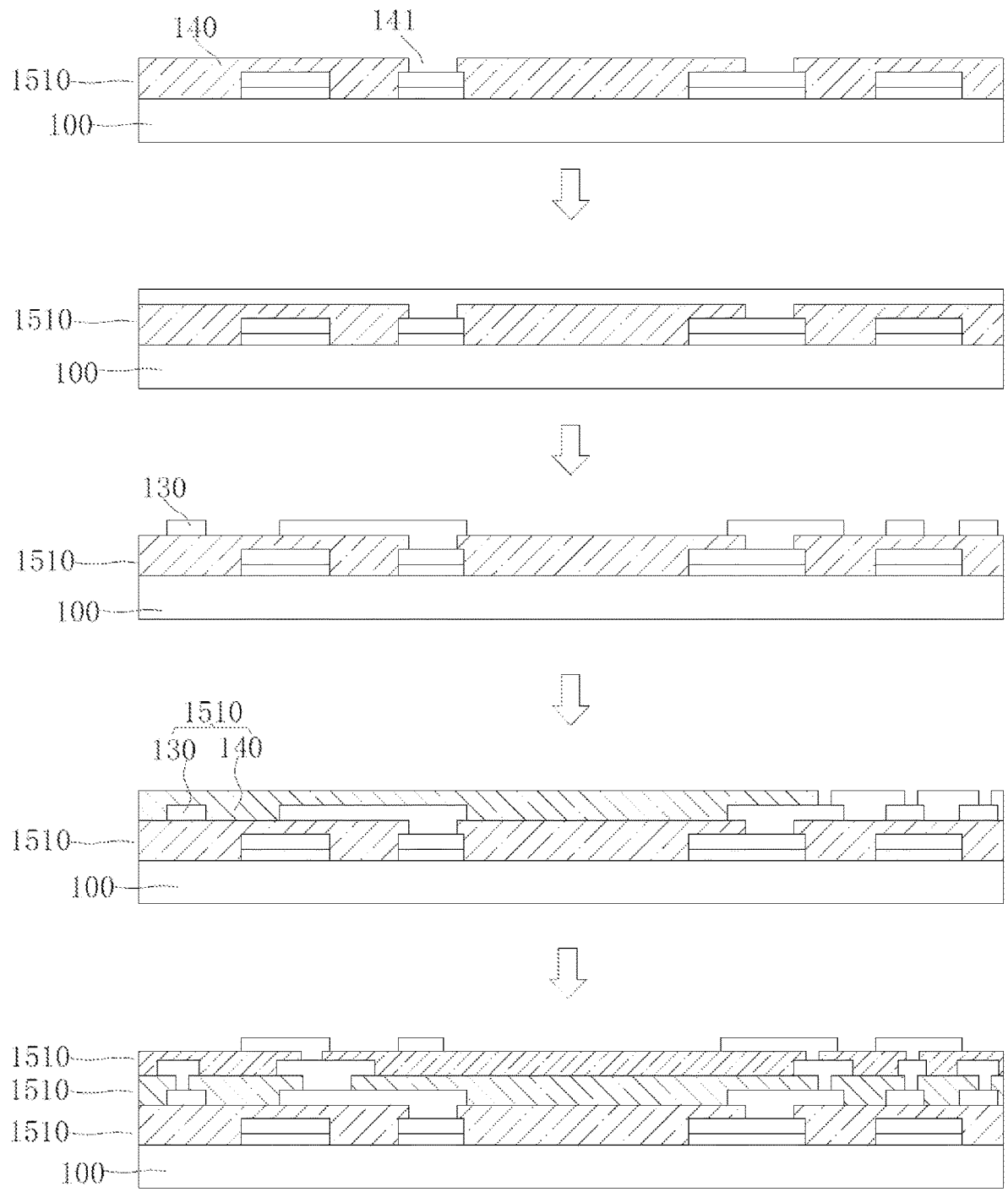
FIG. 8 is a schematic sectional diagram of a manufacturing process of repeatedly piling up laminated plates in a packaging structure according to the present invention.
Figure 9:
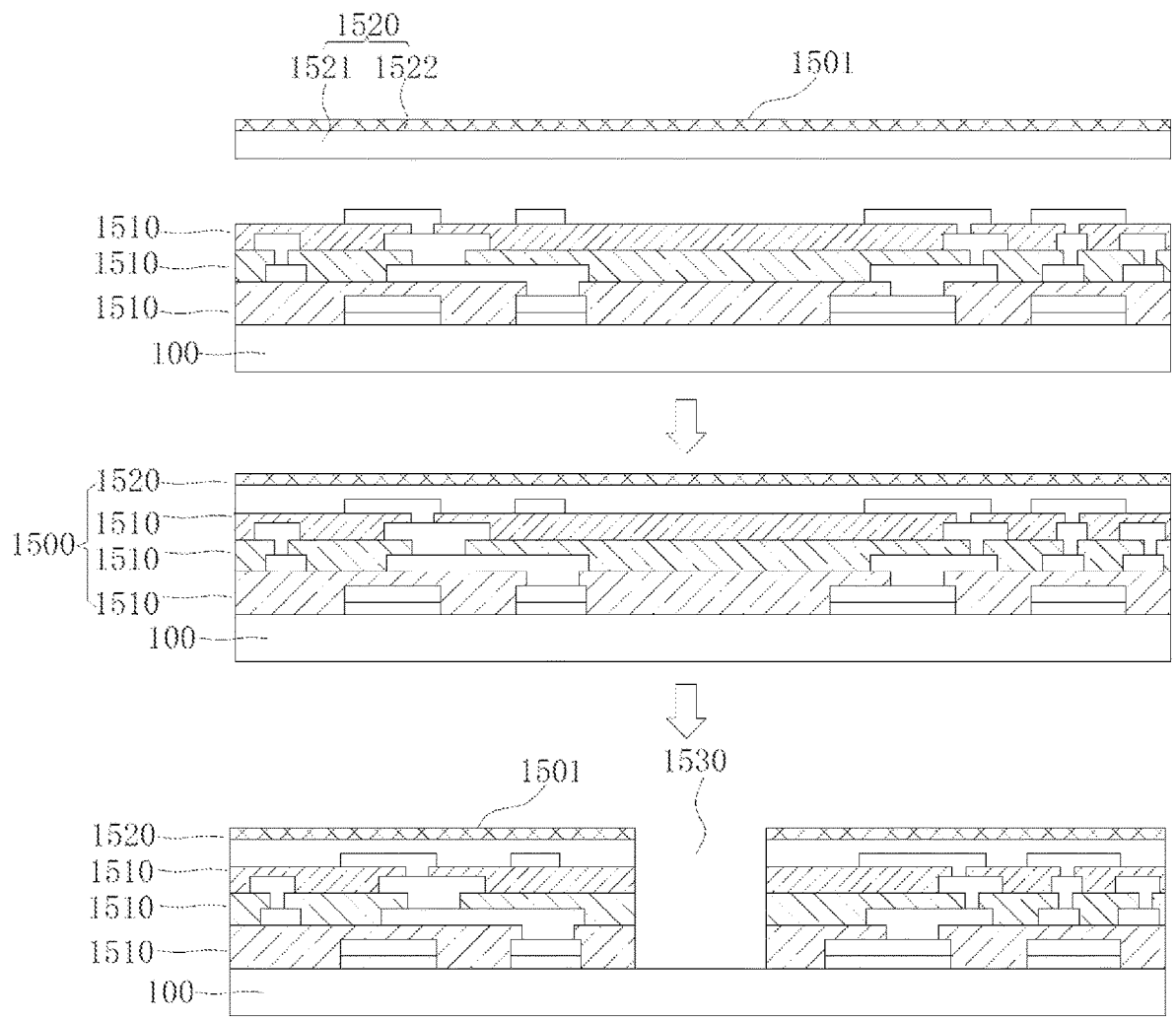
FIG. 9 is a schematic sectional diagram of a manufacturing process according to the present invention, in which a metal foil laminate is piled above a laminated plate and then a cavity is formed.

It can be known from FIGS. 2, 8 and 9, the first chip 1100 is embedded in the cavity 1530. By means of a pre-pressing process, the resin in the prepreg 1521 partially permeates a gap between the cavity 1530 and the first chip 1100. Then, the prepreg 1521 and the resin in the gap are cured by means of a pressing process, such that the first chip 1100 is secured in the cavity 1530. The pre-pressing process is relatively low in laminating temperature, and the relatively low laminating temperature may promote the resin to change from a semi-cured state to a liquid state, seep from the reinforcing material and flow into the gap. The pressing process is relatively high in laminating temperature, and the relatively high laminating temperature may promote the resin to be cured to realize the fixed connection between the first chip 1100 and the first substrate 1500, and may also promote the prepreg 1521 to be cured. In addition, the copper foil layer 1522 is located on the outermost side of the prepreg 1521, which helps to acquire a flat surface in the pre-pressing and pressing processes.

As shown in FIGS. 1, 2, 8, and 9, the cavity 1530 is, for example, a through hole running through the metal foil laminate 1520 and the laminated plate 1510. The first heat-conducting surface 1101 of the first chip 1100 is exposed from one side of the through hole, and subsequently, the first heat conductor 1300 is directly connected to the first heat-conducting surface 1101 to form a heat-conducting channel for the first chip 1100 to dissipate heat.

It should be noted that in other embodiments of the present invention, the cavity may also be a blind hole running through the metal foil laminate and only part of the piled-up laminated plates. In this case, the first heat-conducting surface of the first chip is connected to the bottom of the blind hole, and the first heat conductor may be disposed on the outer side of the bottom of the blind hole, i.e., the first heat conductor is directly connected to the bottom of the blind hole and indirectly connected to the first heat-conducting surface. The first heat conductor and a heat-conducting metal (cooper coin) formed at the bottom of the blind hole are connected by a heat-conducting glue.

As shown in FIGS. 2 and 9, in the packaging structure 1000 according to the present invention, a laminating process is used to enable the resin in the prepreg 1521 of the uppermost-layer metal foil laminate 1520 in the first substrate 1500 to permeate the gap between the cavity 1530 and the first chip 1100 so as to pre-embed the first chip 1100 in the cavity 1530 of the first substrate 1500. In this case, the third connecting surface 1501 of the first substrate 1500 is flush with the first connecting surface 1102 of the first chip 1100.

Continuously referring to FIG. 2, a patterning process and/or a redistributing process is performed on the first substrate 1500 with the first chip 1100 embedded therein; bonding pad structures may be formed on the third connecting surface 1501 of the first substrate 1500 and on the first connecting surface 1102 of the first chip 1100, respectively; and first metal bumps (or solder balls) 1103 and third metal bumps (or solder balls) 1502 are manufactured on the corresponding bonding pad structures.

Next, the second chip 1200 is bonded to the first chip 1100 and the first substrate 1500, and the second chip 1200 is electrically connected to the first metal bumps (or solder balls) 1103 and the third metal bumps (or solder balls) 1502 by second metal bumps (or solder balls) 1203.

In this embodiment, a size of the second chip 1200 is larger than that of the first chip 1100. Therefore, at least one side of the second chip 1200 protrudes from an edge of the first chip 1100, i.e., at least part of the second connecting surface 1202 is opposite to part of the third connecting surface 1501 of the first substrate 1500. Thus, the second chip 1200 can be electrically connected to the first substrate 1500.

Since the first metal bumps (or solder balls) 1103 and the third metal bumps (or solder balls) 1502 are respectively formed on the first connecting surface 1102 and the third connecting surface 1501 that are flush with each other, the first metal bumps (or solder balls) 1103 and the third metal bumps (or solder balls) 1502 have similar heights, without an obvious height difference. When the second chip 1200 is bonded to the first substrate 1500 and the first chip 1100, the second metal bumps (or solder balls) 1203 may be in better contact with the first metal bumps (or solder balls) 1103 and the third metal bumps (or solder balls) 1502. Thus, the electrical connection is more stable and the bonding yield is higher.

In addition, the packaging structure 1000 further includes an interposer 1700 bonded above the first chip 1100 and the first substrate 1500. Similarly, the first metal bumps (or solder balls) 1103 and the third metal bumps (or solder balls) 1502 formed on the first connecting surface 1102 and the third connecting surface 1501 that are flush with each other have similar heights, without an obvious height difference. When the interposer 1700 is bonded to the first substrate 1500 and the first chip 1100, fourth metal bumps (or solders balls) 1701 on the interposer 1700 are in better contact with the first metal bumps (or solder balls) 1103 and the third metal bumps (or solder balls) 1502. Thus, the electrical connection is more stable and the bonding yield is higher.

In other words, the first chip 1100 is embedded in the first substrate 1500, and the first connecting surface 1102 is flush with the third connecting surface 1501, which are obviously beneficial to the increase of the bonding yield of other chips and/or packages that subsequently need to be simultaneously bonded with the first substrate and the first chip.

In this embodiment, the interposer 1700 is configured to power up the first chip 1100, read part of an electrical signal output by the first chip 1100, transmit the read electrical signal to the first substrate 1500, and then output the electrical signal by the first substrate 1500.

Continuously referring to FIGS. 1 and 2, the packaging structure 1000 further includes a second substrate 1600. The second substrate 1600 is for example a PCB. The PCB includes a connecting pad. The connecting pad is electrically connected to fifth metal bumps (or solder balls) 1503 on the back side of the first substrate 1500, such that the second substrate 1600 and the first substrate 1500 are electrically connected to each other.

As shown in FIGS. 1 and 2, the first heat conductor 1300 includes a heat-conducting back plate and an extension extending from the heat-conducting back plate. A notch is formed in the second substrate 1600 and corresponds to the extension, and the extension is inserted into the notch 1601 and connected to the first heat-conducting surface 1101 exposed outside the cavity 1530 of the first substrate 1500.

In addition, the heat-conducting back plate is disposed below the second substrate 1600 and combined with the second substrate 1600, such that heat may be exported by a material with a high heat conductivity in the second substrate 1600, i.e., part of the heat of the first heat conductor 1300 may be exported by the second substrate 1600, which further improves the heat dissipation efficiency.

In the packaging structure 1000 according to the present invention, a heat-conducting channel is formed on each of the heat-conducting surfaces, facing away from each other, of the first chip 1100 and the second chip 1200 that are vertically connected. Therefore, the heat dissipation efficiency of the packaging structure 1000 can be significantly improved.

Figure 3:
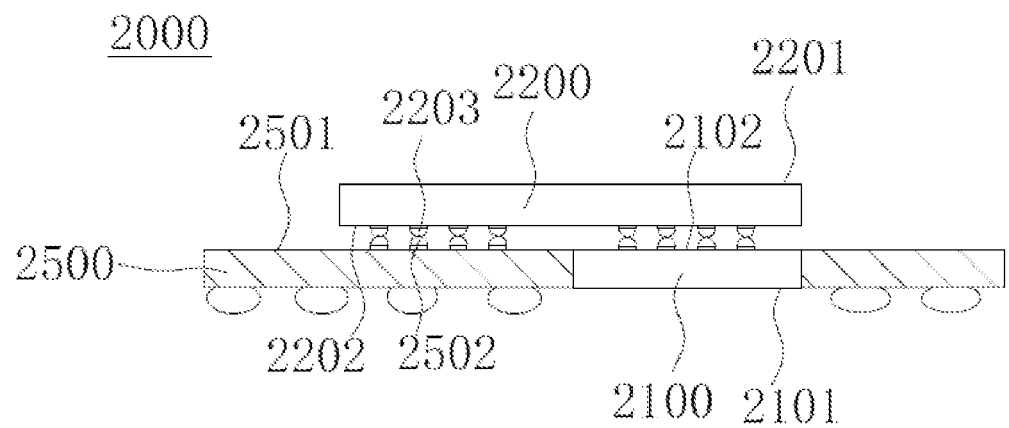
FIG. 3 is a schematic sectional diagram of a packaging structure according to a second embodiment of the present invention, from which a first heat conductor, a second heat conductor and a second substrate are removed.

As shown in FIG. 3, a packaging structure 2000 is further provided according to a second embodiment of the present invention, and differs from the packaging structure 1000 in that the packaging structure 2000 does not include an interposer.

In addition, in order to simplify the diagram, illustrations of the first heat conductor, the second heat conductor and the second substrate are omitted in the packaging structure 2000 shown in FIG. 3. A reference may be made to FIG. 1 for the first heat conductor, the second heat conductor and the second substrate that are omitted, which is not repeated herein.

By means of a laminating process, a first chip 2100 is pre-embedded in a cavity of a first substrate 2500. A first connecting surface 2102 of the first chip 2100 is flush with a third connecting surface 2501 of the first substrate 2500. A first heat-conducting surface 2101 of the first chip 2100 is connected to a first heat conductor. A second heat-conducting surface 2201 of a second chip 2200 is connected to a second heat conductor.

The second chip 2200 is bonded to the first substrate 2500 with the first chip 2100 embedded therein. The size of the second chip 2200 is larger than that of the first chip 2100. A single side of the second chip 2200 protrudes from an edge of the first chip 2100. A part of a second connecting surface 2202 of the second chip 2200 faces a part of the third connecting surface 2501 of the first substrate 2500. Second metal bumps (or solder balls) 2203 on the second connecting surface 2202 are electrically connected to third metal bumps (or solder balls) 2502 on the third connecting surface 2501. The second metal bumps (or solder balls) 2203 and the third metal bumps (or solder balls) 2502 are electrically connected by means of, but not limited to, tin-gold bonding.

In this embodiment, the second chip 2200 is electrically connected to the first chip 2100 and the first substrate 2500 that are below the second chip 2200. For example, the first chip 2100 is an HBM and the second chip 2200 is a CPU. The HBM may be powered up by the CPU or by the redistributed first substrate 2500 after redistribution is performed on the first substrate 2500.

Figure 4:
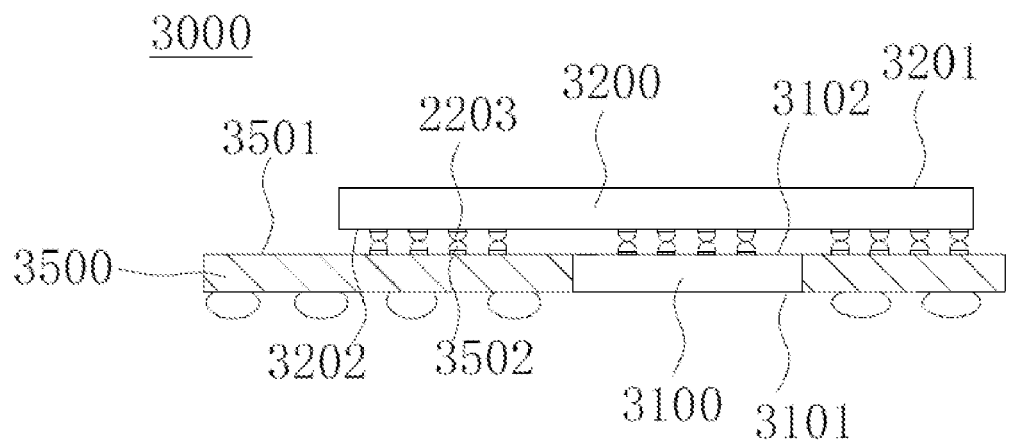
FIG. 4 is a schematic sectional diagram of a packaging structure according to a third embodiment of the present invention, from which a first heat conductor, a second heat conductor and a second substrate are removed.

As shown in FIG. 4, a third embodiment of the present invention further provides a packaging structure 3000, which differs from the packaging structure 1000 in that the packaging structure 3000 does not include an interposer, and two sides of a second chip 3200 protrude from an edge of a first chip 3100 and are electrically connected to a first substrate 3500.

In addition, in order to simplify the diagram, illustrations of the first heat conductor, the second heat conductor and the second substrate are omitted in the packaging structure 3000 shown in FIG. 4. A reference may be made to FIG. 1 for the first heat conductor, the second heat conductor and the second substrate that are omitted, which is not repeated herein.

By means of the laminating process, the first chip 3100 is pre-embedded in a cavity of the first substrate 3500. A first connecting surface 3102 of the first chip 3100 is flush with a third connecting surface 3501 of the first substrate 3500. A first heat-conducting surface 3101 of the first chip 3100 is connected to a first heat conductor. A second heat-conducting surface 3201 of the second chip 3200 is connected to a second heat conductor.

The second chip 3200 is bonded to the first substrate 3500 with the first chip 3100 embedded therein. The size of the second chip 3200 is larger than that of the first chip 3100. Each of two sides of the second chip 3200 protrudes from an edge of the first chip 3100. A part of a second connecting surface 3202 of the second chip 3200 faces a part of the third connecting surface 3501 of the first substrate 3500. Second metal bumps (or solder balls) 3203 on the second connecting surface 3202 are electrically connected to third metal bumps (or solder balls) 3502 on the third connecting surface 3501. The second metal bumps (or solder balls) 3203 and the third metal bumps (or solder balls) 3502 are electrically connected by means of, but not limited to, tin-gold bonding.

In this embodiment, the second chip 3200 is electrically connected to the first chip 3100 and the first substrate 3500 that are below the second chip 3200. For example, the first chip 3100 is an HBM and the second chip 3200 is a CPU.

Figure 5:
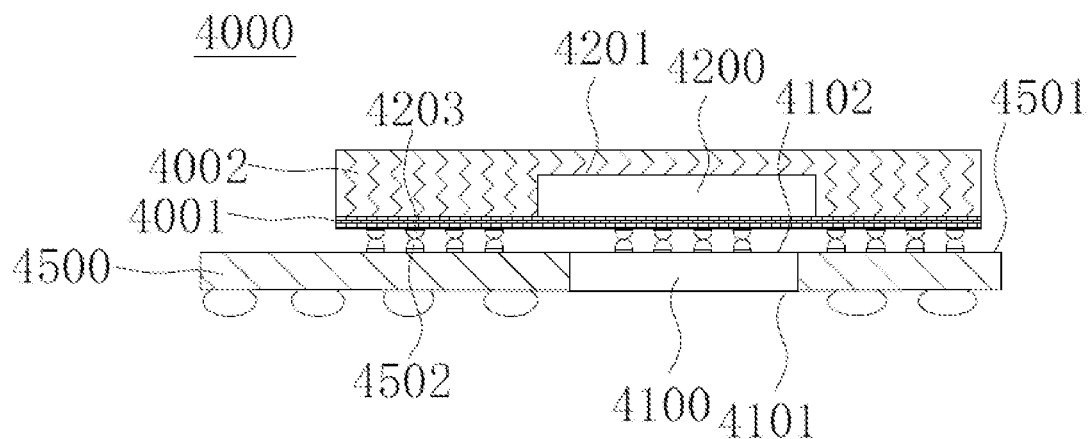
FIG. 5 is a schematic sectional diagram of a packaging structure according to a fourth embodiment of the present invention, from which a first heat conductor, a second heat conductor and a second substrate are removed.

As shown in FIG. 5, a packaging structure 4000 is further provided according to a fourth embodiment of the present invention, and differs from the packaging structure 1000 in that 1) the packaging structure 4000 does not include an interposer; and 2) a second chip 4200 includes a redistribution layer 4001 and a plastic package layer 4002, and each of the two sides of the redistribution layer 4001 protrudes from an edge of a first chip 4100 and is electrically connected to a first substrate 4500.

In addition, in order to simplify the diagram, illustrations of the first heat conductor, the second heat conductor and the second substrate are omitted in the packaging structure 4000 shown in FIG. 5. A reference may be made to FIG. 1 for the first heat conductor, the second heat conductor and the second substrate that are omitted, which is not repeated herein.

In this embodiment, the second chip 4200 includes the plastic package layer 4002 around the second chip 4200; an active layer of the second chip 4200 is exposed from the plastic package layer 4002 and is approximately flush with the plastic package layer 4002; the redistribution layer 4001 is formed on one side of the plastic package layer 4002, and is electrically connected to the active layer; and thus, a second chip component is formed by reconstruction.

By means of the laminating process, the first chip 4100 is pre-embedded in the cavity of the first substrate 4500. A first connecting surface 4102 of the first chip 4100 is flush with a third connecting surface 4501 of the first substrate 4500.

The second chip 4200, which includes the plastic package layer 4002 and the redistribution layer 4001, is bonded to the first substrate 4500 with the first chip 4100 embedded therein. Each of two sides of the redistribution layer 4001 protrudes from the edge of the first chip 4100. Second metal bumps (or solder balls) 4203 are disposed on a part of the surface of the redistribution layer 4001 facing the first substrate 4500. The second metal bumps (or solder balls) 4203 are electrically connected to third metal bumps (or solder balls) 4502 on the third connecting surface 4501. The second metal bumps (or solder balls) 4203 and the third metal bumps (or solder balls) 4502 are electrically connected by means of, but not limited to, tin-gold bonding.

In this embodiment, the second chip 4200 is electrically connected to the first chip 4100 and the first substrate 4500 that are below the second chip 4200 by the redistribution layer 4001. For example, the first chip 4100 is an HBM and the second chip 4200 is a CPU.

In addition, the plastic package layer 4002 may be filled with a material with a high heat conductivity, such that the plastic package layer 4002 may be used as a second heat conductor on a second heat-conducting surface 4201 of the second chip 4200. Moreover, a first heat-conducting surface 4101 of the first chip 4100 is connected to a first heat conductor.

Figure 6:
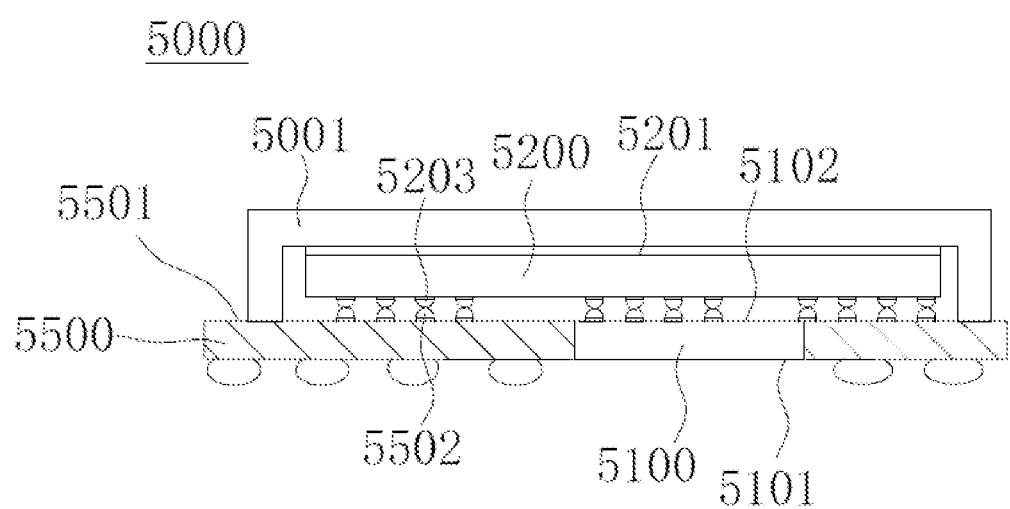
FIG. 6 is a schematic sectional diagram of a packaging structure according to the fourth embodiment of the present invention, from which a first heat conductor, a second heat conductor and a second substrate are removed.

As shown in FIG. 6, a packaging structure 5000 is further provided according to the fourth embodiment of the present invention, and differs from the packaging structure 1000 in that 1) the packaging structure 5000 does not include an interposer; and 2) a connecting structure 5001 on a second heat-conducting surface 5201 of a second chip 5200 is connected to a first substrate 5500.

In addition, in order to simplify the diagram, illustrations of the first heat conductor, the second heat conductor and the second substrate are omitted in the packaging structure 5000 shown in FIG. 6. A reference may be made to FIG. 1 for the first heat conductor, the second heat conductor and the second substrate that are omitted, which is not repeated herein.

By means of the laminating process, a first chip 5100 is pre-embedded in a cavity of the first substrate 5500. A first connecting surface 5102 of the first chip 5100 is flush with a third connecting surface 5501 of the first substrate 5500. A first heat-conducting surface 5101 of the first chip 5100 is connected to a first heat conductor.

The second chip 5200 is bonded to the first substrate 5500 with the first chip 5100 embedded therein. The size of the second chip 5200 is larger than that of the first chip 5100. Each of two sides of the second chip 5200 protrudes from an edge of the first chip 5100. A part of a second connecting surface 5202 of the second chip 5200 faces a part of the third connecting surface 5501 of the first substrate 5500. Second metal bumps (or solder balls) 5203 on the second connecting surface 5202 are electrically connected to third metal bumps (or solder balls) 5502 on the third connecting surface 5501. The second metal bumps (or solder balls) 5203 and the third metal bumps (or solder balls) 5502 are electrically connected by means of, but not limited to, tin-gold bonding.

The second heat-conducting surface 5201 is provided with an integrated heat spreader (IHS) 5001 with an inverted U-shaped section. The IHS 5001 and the second heat-conducting surface 5201 of the second chip 5200 are connected by a heat-conducting material.

Figure 13:
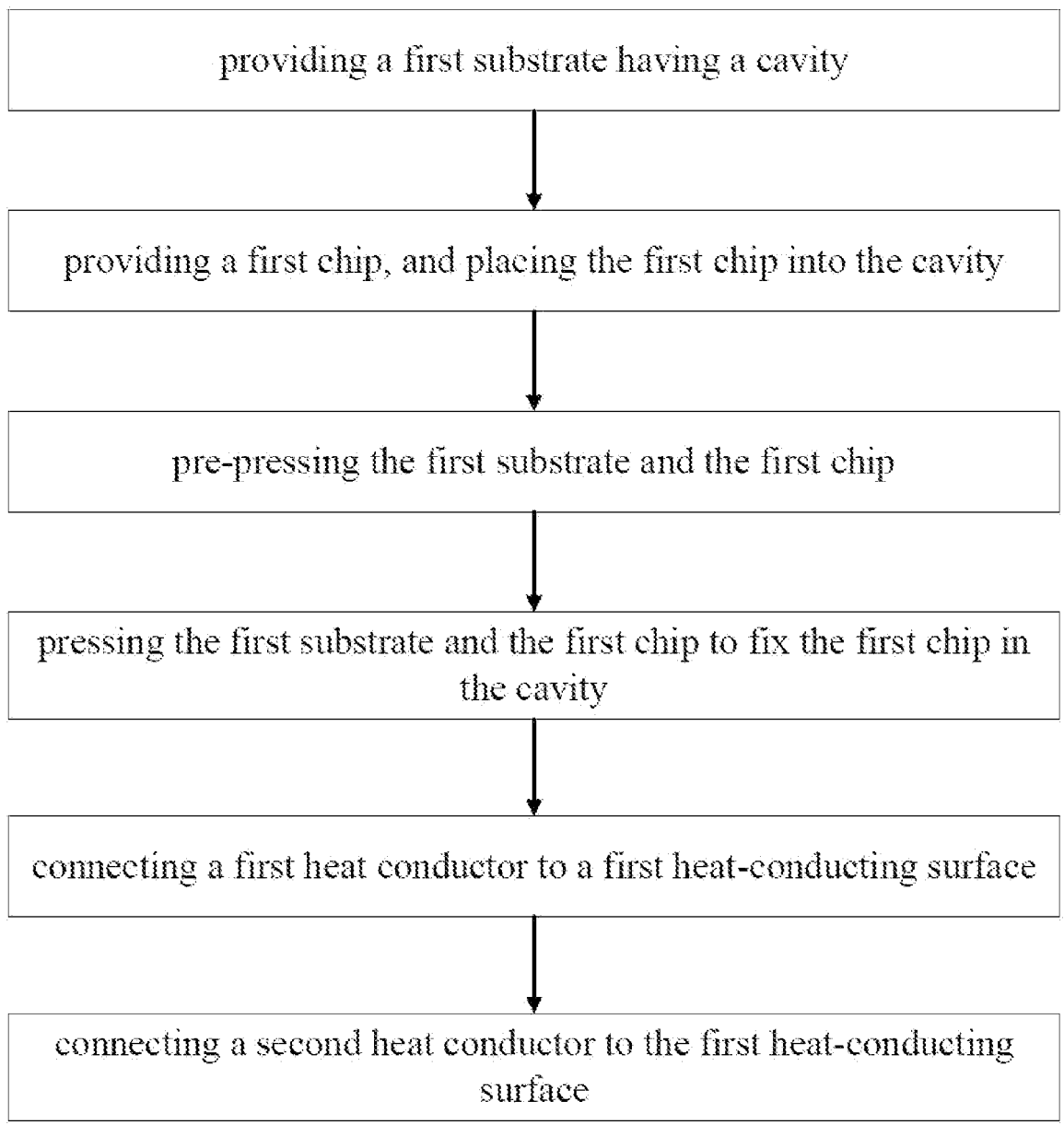
FIG. 13 is a flow chart of a manufacturing process of a packaging structure according to the present invention.

As shown in FIG. 13, another object of the present invention is to provide a manufacturing method 200 of a packaging structure, including:
   providing a first substrate having a cavity;
   providing a first chip, and placing the first chip into the cavity;
   pre-pressing the first substrate and the first chip;
   pressing the first substrate and the first chip to fix the first chip in the cavity;
   bonding a second chip onto a first connecting surface of the first chip; and
   connecting a first heat conductor to a first heat-conducting surface of the first chip, and connecting a second heat conductor to a second heat-conducting surface of the second chip.

A third connecting surface of the first substrate is flush with the first connecting surface of the first chip.

In a preferred embodiment, the first substrate includes a laminated plate and a metal foil laminate piled above the laminated plate. The metal foil laminate includes a prepreg and a metal foil layer disposed on a surface of a side of the prepreg. A surface of the metal foil layer is provided as the third connecting surface.

In a preferred embodiment, providing the first substrate having the cavity further includes: providing a carrier plate; alternately manufacturing a conductive layer and an insulating layer on a surface of the carrier plate to constitute the laminated plate; forming a first opening in the laminated plate; providing the metal foil laminate having a second opening; and piling the metal foil laminate above the laminated plate to enable the first opening and the second opening to be communicated with each other. The first opening and the second opening constitute the cavity.

In a preferred embodiment, providing the first substrate having the cavity further includes: providing a carrier plate; alternately manufacturing a conductive layer and an insulating layer on a surface of the carrier plate to constitute the laminated plate; providing the metal foil laminate, and piling the metal foil laminate above the laminated plate to constitute the first substrate; and forming the cavity in the first substrate.

In a preferred embodiment, the manufacturing method further includes: patterning the metal foil layer to form a plurality of bonding pad structures; and manufacturing second metal bumps or solder balls on the plurality of bonding pad structures.

With reference to FIGS. 1, 2, 7 and 9, the manufacturing process in the above-mentioned manufacturing method 200 will be explained in detail by taking the packaging structure 1000 as an example.

Figure 7:
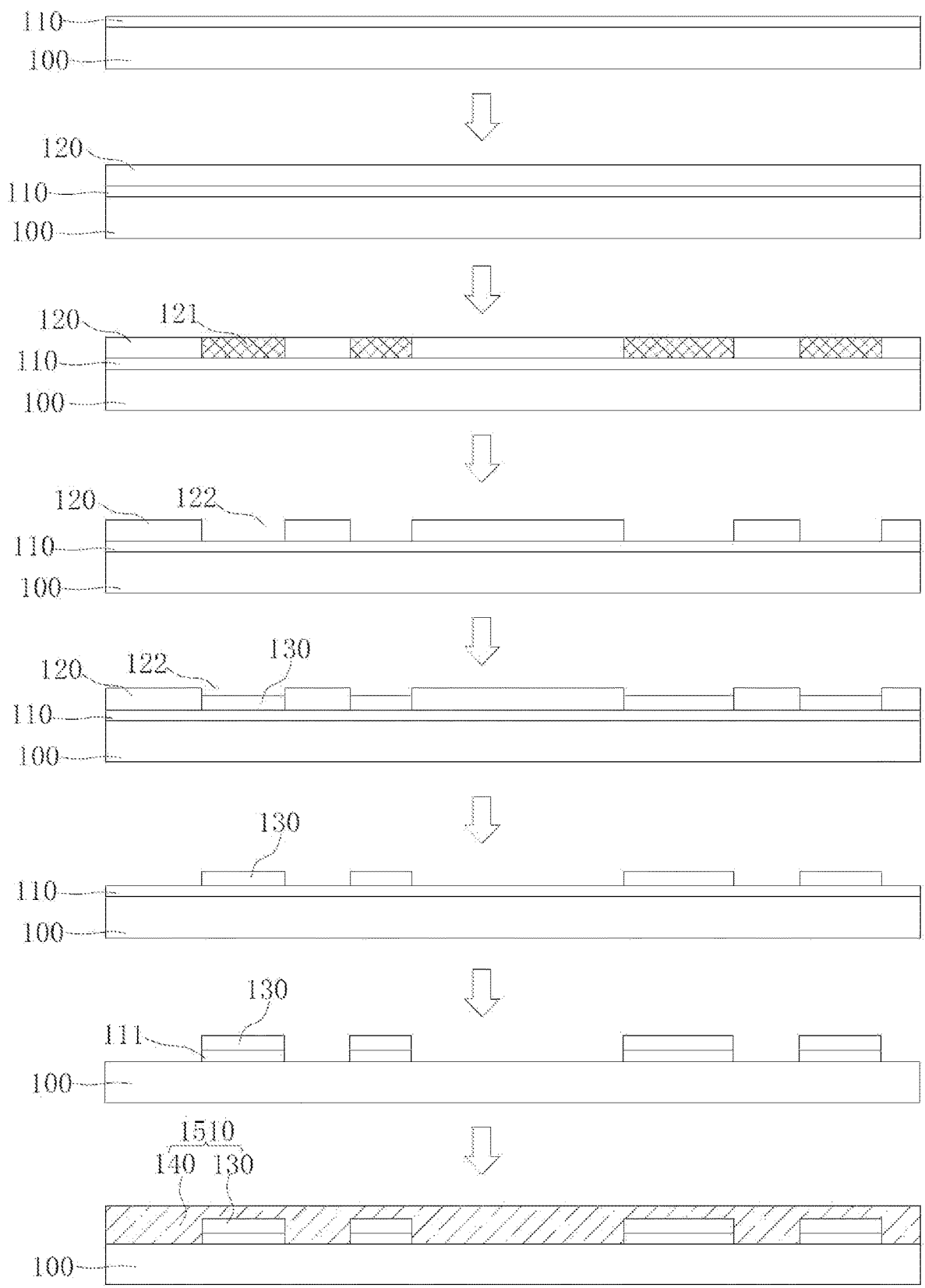
FIG. 7 is a schematic sectional diagram of a process of manufacturing a laminated plate in a packaging structure according to the present invention.

As shown in FIG. 7, the manufacturing process includes: providing a carrier plate 100, and forming a conductive layer 110 on a surface of a side of the carrier plate 100; forming a photoresist layer 120 on the conductive layer 110; patterning the photoresist layer 120 to form an exposed area 121; acquiring an opening 122 by removing a photoresist in the exposed area 121; evaporating a thickened conductive layer 130 into the opening 122; removing the photoresist layer 120; acquiring conductive patterns 111 by patterning the conductive layer 110, and laminating the conductive patterns 111 and the thickened conductive layer 130; and forming an insulating layer 140 to cover the conductive patterns 111 and the thickened conductive layer 130.

The insulating layer 140 and the thickened conductive layer 130 constitute the laminated plate 1510.

As shown in FIG. 8, the conductive layer 130 and the insulating layer 140 are repeatedly manufactured to form multiple laminated plates 1510 that are piled up. The insulating layer 140 is provided with via holes 141. The conductive layers 130 in the multiple laminated plates 1510 that are piled up are electrically connected through the via holes 141. The via holes 141 are formed by, for example, an etching patterning process.

In this embodiment, the insulating layer 140 is formed by, for example, coating with a dielectric material and curing a dielectric material, but not limited thereto. In other embodiments of the present invention, the insulating layer may be a prepreg, and the prepreg is directly attached and secured to the conductive layer.

As shown in FIG. 9, a metal foil laminate 1520 is provided and piled above the multiple laminated plates 1510 to constitute the first substrate 1500. A metal foil layer 1522 of the metal foil laminate 1520 is disposed on the outermost side of the first substrate 1500.

A cavity 1530 is formed, by means of etching or cutting, in an area of the first substrate 1500 where the conductive layer 130 is not provided.

In this embodiment, the cavity 1530 runs through holes in the metal foil laminate 1520 and in the multiple laminated plates 1510.

Figure 10:
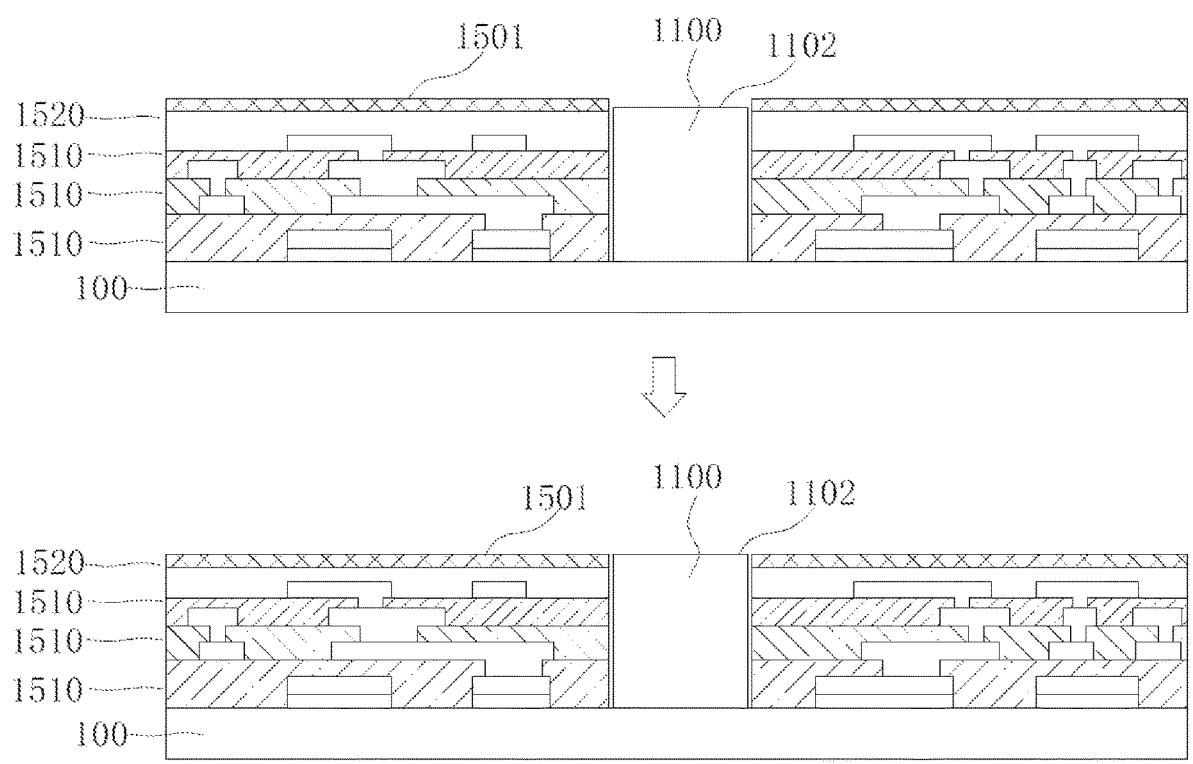
FIG. 10 is a schematic sectional diagram of embedding a first chip in the cavity formed in FIG. 9 for lamination.

As shown in FIG. 10, the first chip 1100 is placed in the cavity 1530. By pre-pressing, the resin in the prepreg 1521 seeps from the gap between the first chip 1100 and the cavity 1530. By pressing, the prepreg 1521 and the exuded resin are cured, and the third connecting surface 1503 is flush with the first connecting surface 1102.

Figure 11:
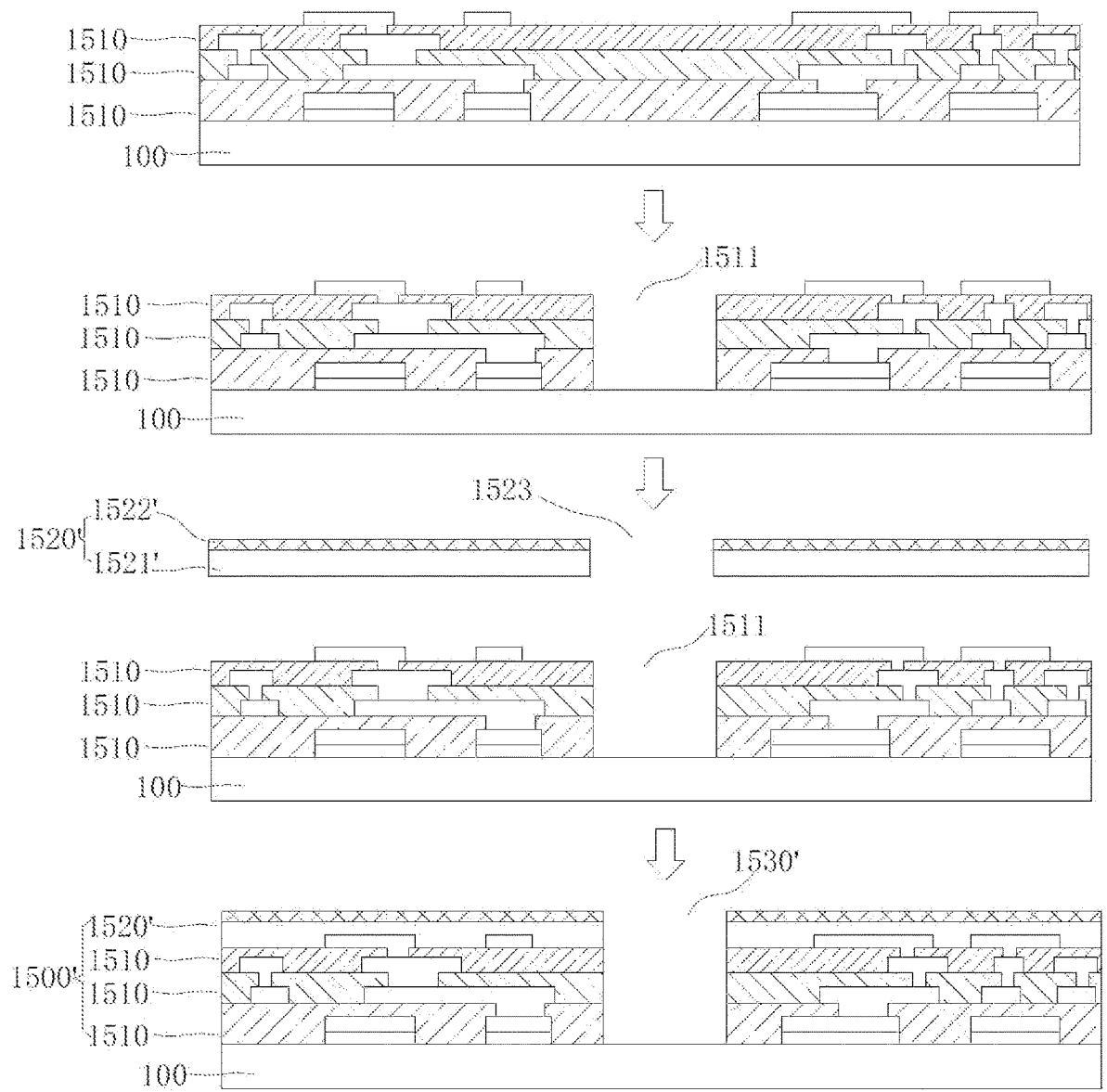
FIG. 11 is a schematic sectional diagram of another manufacturing process according to the present invention, in which an opening is formed in a laminated plate first and then a cavity is formed by piling the laminated plate above a metal foil laminate having an opening.

As shown in FIG. 11, a method of forming a cavity 1530' on a first substrate 1500' is further provided according to the present invention.

First, after multiple laminated plates 1510 are piled on the carrier plate 100, first openings 1511 are formed, by means of cutting, etching and the like, in areas of the multiple laminated plates 1510 where the conductive layer 130 is not provided. Then, a metal foil laminate 1520' with a prefabricated second opening 1523 is provided, and the second opening 1523 runs through a metal foil layer 1522' and a prepreg 1521' from top to bottom. The metal foil laminate 1520' is piled above the multiple laminated plates 1510 to constitute the first substrate 1500'. The first opening 1511 and the second opening 1523 are aligned and communicated with each other to constitute the cavity 1530'.

In this embodiment, the first opening 1511 runs through the multiple laminated plates 1510 that are piled up. It is to be noted that in other embodiments of the present invention, the first opening may also run through part of the multiple laminated plates.

Figure 12:
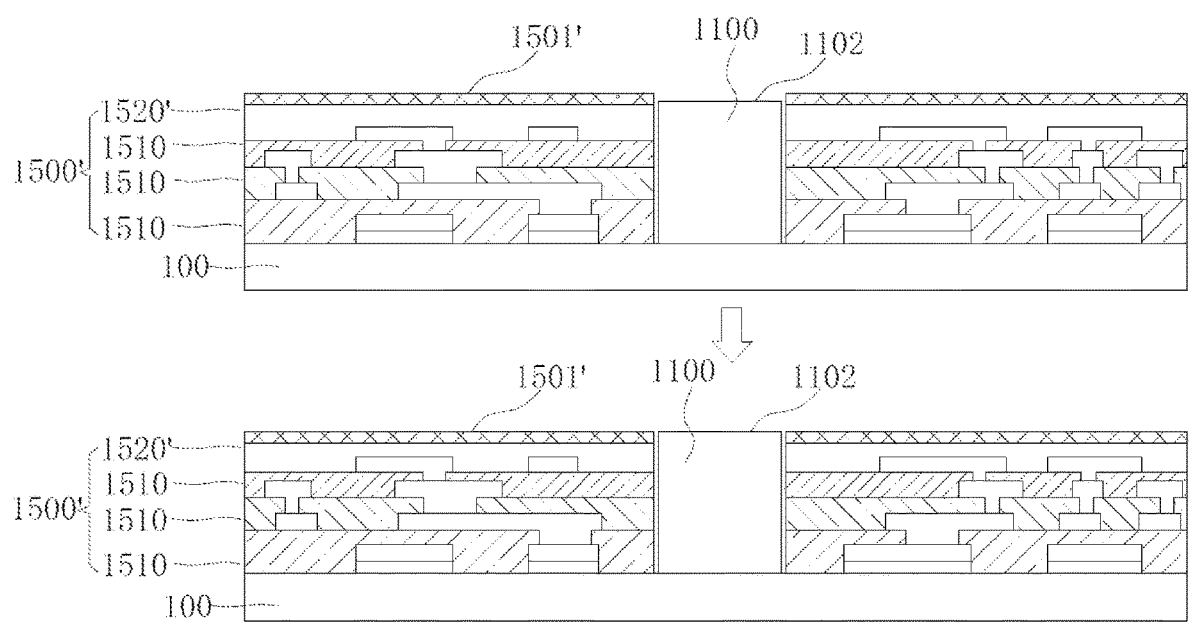
FIG. 12 is a schematic sectional diagram of embedding a first chip in the cavity formed in FIG. 11 for lamination.

As shown in FIGS. 11 and 12, the first chip 1100 is placed in the cavity 1530'. By pre-pressing, the resin in the prepreg 1521' seeps from the gap between the first chip 1100 and the cavity 1530'. By pressing, the prepreg 1521' and the exuded resin are cured, and a third connecting surface 1501' of a metal foil layer 1522' is flush with the first connecting surface 1102.

Continuously referring to FIGS. 11 and 2, after the lamination process is completed, a plurality of bonding pads may be formed by patterning the metal foil layer 1522. Third metal bumps 1502 (for example, metal blocks with tin caps) or solder balls may be manufactured on the bonding pads. First metal bumps 1103 (for example, metal blocks with tin caps) or solder balls may be manufactured on the first chip 1100 by means of redistribution, etc.

In addition, the carrier plate 100 may be removed by means of a debonding process after the first chip 1100 is embedded in the cavity 1530 of the first substrate 1500.

It can be understood that in other embodiments of the present invention, in FIGS. 7 and 12, the first substrate may be simultaneously manufactured on each of two sides of the carrier plate. The first chips may be embedded in the cavities of the first substrates. Two identical first substrates with the first chips embedded therein may be acquired after the carrier plate is removed.

The first substrate 1500 with the first chip 1100 embedded therein is used as a package substrate. The second chip 1200 is bonded above the package substrate, and an optional interposer 1700 is bonded above the first chip 1100 and the first substrate 1500. Both of the second chip 1200 and the optional interposer 1700 are electrically connected to the first chip 1100 and the first substrate 1500 simultaneously.

In addition, the method further includes: bonding the second substrate 1600 to one side of the first substrate 1500, enabling a notch 1601 in the second substrate 1600 to be aligned with the cavity 1530, and exposing the first heat-conducting surface 1101 in the notch 1601; inserting the extension of the first heat conductor 1300 into the notch

1601 and connecting the extension to the first heat-conducting surface 1101; and connecting the second heat conductor 1400 to the second heat-conducting surface 1201 of the second chip 1200.

The present invention provides the packaging structure and the manufacturing method thereof. The packaging structure includes the first substrate with the first chip pre-embedded therein; the first connecting surface of the first chip is flush with the third connecting surface of the first substrate to constitute a flat surface; the substantially identical bonding pad structures are manufactured on the flat surface using a patterning process; and the metal bumps or solder balls are then manufactured on the bonding pad structures. When the metal bumps or solder balls as a whole are electrically connected to other chips and packages, the stability of the electrical connection can be improved and the packaging yield can also be increased. In addition, since the first chip is embedded in the first substrate, and respective independent heat-conducting channels for heat dissipation are formed for the first chip and the second chip by using the first heat conductor and the second heat conductor corresponding to the first chip and the second chip, respectively, the overall heat dissipation efficiency of the packaging structure is relatively high and is less influenced by the package substrate.

The present invention has been described by the above-mentioned related embodiments which, however, are only examples for implementing the present invention. In addition, the technical features involved in the different embodiments of the present invention described above can be combined with each other as long as they do not conflict with each other. It is necessary to point out that the present invention may have many other embodiments, and those skilled in the art can make various corresponding changes and modifications according to the present invention without departing from the spirit and essence of the present invention, but these corresponding changes and modifications should all fall within the scope of protection of the appended claims.

What is claimed is:

1. A packaging structure, comprising:
   a first substrate, comprising a cavity;
   a first chip, embedded in the cavity and comprising a first connecting surface and a first heat-conducting surface that face away from each other;
   a second chip, disposed on a side of the first connecting surface and electrically connected to the first chip, and a side of the second chip distal from the first chip comprising a second heat-conducting surface; and
   a first heat conductor and a second heat conductor, the first heat conductor being connected to the first heat-conducting surface, and the second heat conductor being connected to the second heat-conducting surface;
   wherein the first substrate comprises a third connecting surface that is flush with the first connecting surface;
   wherein the first substrate comprises a laminated plate and a metal foil laminate piled above the laminated plate, the metal foil laminate comprises a prepreg and a metal foil layer disposed on a surface of a side of the prepreg, and a surface of an outer side of the metal foil layer is provided as the third connecting surface;
   wherein the prepreg comprises resin, and is laminated such that the resin enters the cavity and fixes the first chip.

2. The packaging structure according to claim 1, wherein a size of the second chip is larger than a size of the first chip; a side of the second chip proximal to the first chip comprises a second connecting surface; a first metal bump is disposed on a part of the second connecting surface located outside the first chip; a second metal bump is disposed on the metal foil layer; and the first metal bump and the second metal bump are in electrical connection with each other.

3. The packaging structure according to claim 1, wherein the cavity runs through the metal foil laminate and at least part of the laminated plate in a thickness direction of the first substrate.

4. A method for manufacturing the packaging structure according to claim 1, comprising:
   providing the first substrate having a cavity;
   providing the first chip, and placing the first chip into the cavity;
   pre-pressing the first substrate and the first chip;
   pressing the first substrate and the first chip to fix the first chip in the cavity;
   bonding the second chip onto the first connecting surface of the first chip; and
   connecting the first heat conductor to the first heat-conducting surface of the first chip, and connecting the second heat conductor to the second heat-conducting surface of the second chip.

5. The method according to claim 4, wherein providing the first substrate having the cavity further comprises:
   providing a carrier plate;
   alternately manufacturing a conductive layer and an insulating layer on a surface of the carrier plate to constitute the laminated plate;
   forming a first opening in the laminated plate;
   providing the metal foil laminate having a second opening; and
   piling the metal foil laminate above the laminated plate to enable the first opening and the second opening to be communicated with each other;
   wherein the first opening and the second opening constitute the cavity.

6. The method according to claim 4, wherein providing the first substrate having the cavity further comprises:
   providing a carrier plate;
   alternately manufacturing a conductive layer and an insulating layer on a surface of the carrier plate to constitute the laminated plate;
   providing the metal foil laminate, and piling the metal foil laminate above the laminated plate to constitute the first substrate; and
   forming the cavity in the first substrate.

7. The method according to claim 4, further comprising:
   patterning the metal foil layer to form a plurality of bonding pad structures; and
   manufacturing second metal bumps or solder balls on the plurality of bonding pad structures.

* * * * *